United States Patent
Cok et al.

(10) Patent No.: US 8,425,716 B2
(45) Date of Patent: Apr. 23, 2013

(54) APPLYING CHIPLETS TO SUBSTRATES

(75) Inventors: Ronald S. Cok, Rochester, NY (US);
John W. Hamer, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 479 days.

(21) Appl. No.: 12/489,486

(22) Filed: Jun. 23, 2009

(65) Prior Publication Data

US 2010/0319847 A1    Dec. 23, 2010

(51) Int. Cl.
*B29C 65/52*    (2006.01)
*B32B 37/14*    (2006.01)

(52) U.S. Cl.
USPC .............. 156/298; 156/299; 156/300; 29/831

(58) Field of Classification Search ........... 257/E27.001–E27.163; 438/128; 156/297–300, 265, 272.2, 272.8, 272.9, 275.5; 29/831, 832
See application file for complete search history.

(56) References Cited

U.S. PATENT DOCUMENTS

| | | | | |
|---|---|---|---|---|
| 5,250,843 A | * | 10/1993 | Eichelberger | 257/692 |
| 5,550,066 A | | 8/1996 | Tang et al. | |
| 5,844,200 A | * | 12/1998 | Leader et al. | 219/121.71 |
| 6,407,385 B1 | * | 6/2002 | Okada | 850/3 |
| 6,862,490 B1 | * | 3/2005 | Duignan | 700/121 |
| 2005/0141150 A1 | * | 6/2005 | Bentley et al. | 361/2 |
| 2006/0055864 A1 | | 3/2006 | Matsumura et al. | |
| 2006/0134799 A1 | | 6/2006 | Sharma et al. | |
| 2006/0220989 A1 | | 10/2006 | Hillis et al. | |
| 2007/0079571 A1 | | 4/2007 | Schatz | |
| 2007/0158804 A1 | | 7/2007 | Hosoya et al. | |
| 2008/0313894 A1 | * | 12/2008 | Fillion et al. | 29/840 |

FOREIGN PATENT DOCUMENTS

WO    03015490 A2    2/2003

* cited by examiner

*Primary Examiner* — Katarzyna Wyrozebski Lee
*Assistant Examiner* — Scott W Dodds
(74) *Attorney, Agent, or Firm* — Global OLED Technology LLC (57) ABSTRACT

A method of providing chiplets over a substrate including providing in sequence a substrate; coating an adhesive in a layer over the substrate; placing a plurality of first chiplets onto the adhesive layer in separated chiplet location(s) to adhere the first chiplets to the adhesive layer, wherein one or more of the first chiplets do not adhere to the adhesive layer, so that first chiplet(s) are adhered to the adhesive layer in adhered chiplet location(s) and first chiplet(s) are not adhered in non-adhered chiplet location(s); locally processing the adhesive layer in the non-adhered chiplet location(s) to condition the adhesive layer in the non-adhered locations to receive second chiplets; placing second chiplet(s) onto the adhesive layer in the conditioned non-adhered chiplet location(s) to adhere the second chiplets in the adhesive layer in the non-adhered locations; and curing the adhesive.

10 Claims, 8 Drawing Sheets

APPLYING CHIPLETS TO SUBSTRATES

CROSS-REFERENCE TO RELATED APPLICATION

Reference is made to commonly assigned U.S. patent application Ser. No. 12/191,478 filed Aug. 14, 2008, entitled "OLED Device With Embedded Chip Driving" by Dustin L. Winters et al the disclosure of which is incorporated herein.

FIELD OF THE INVENTION

The present invention relates to a method of applying chiplets to substrates.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Display devices are typically controlled with either a passive-matrix control employing electronic circuitry external to the substrate or an active-matrix control employing electronic circuitry formed directly on the substrate. Organic light emitting diode (OLED) display devices have been fabricated with active-matrix (AM) driving circuitry in order to produce high-performance displays. An example of such an AM OLED display device is disclosed in U.S. Pat. No. 5,550,066. Active-matrix circuitry is commonly achieved by forming thin-film transistors (TFTs) over a substrate and employing a separate circuit to control each light-emitting pixel in the display.

In an active-matrix device, active control elements include thin-films of semiconductor material formed over a substrate, for example amorphous or poly-crystalline silicon, and distributed over a flat-panel display substrate. Typically, each display sub-pixel is controlled by one control element and each control element includes at least one transistor. For example, in a simple active-matrix organic light-emitting display, each control element includes two transistors (a select transistor and a power transistor) and one capacitor for storing a charge specifying the luminance of the sub-pixel. Each light-emitting element typically employs an independent control electrode and a common electrode. Control of the light-emitting elements is typically provided through a data signal line, a select signal line, a power connection and a ground connection formed as metal wires over the substrate. Active-matrix elements are not necessarily limited to displays and can be distributed over a substrate and employed in other applications requiring spatially distributed control.

Thin-film transistors (TFTs) are composed of a thin layer (usually 100-400 nm) of a semiconductor such as amorphous silicon or polysilicon. The properties of such thin-film semiconductors are, however, often not sufficient for constructing a high-quality display. Amorphous silicon, for example, is unstable in that its threshold voltage (Vth) and carrier mobility shifts over extended periods of use. Polysilicon often has a large degree of variability across the substrate in threshold voltage (Vth) and carrier mobility due to the crystallization process. Since OLED devices operate by current injection, variability in the TFTs can result in variability of the luminance of the OLED pixels and degrade the visual quality of the display. Novel compensation schemes, such as adding additional TFT circuitry in each pixel, have been proposed to compensate for TFT variability, however, such compensation adds complexity which can negatively impact yield, cost, or reduce the OLED emission area. Furthermore, as thin-film transistor fabrication processes are applied to larger substrates such as used for large flat-panel television applications, the variability and process cost increase.

One approach to avoid these issues with thin-film transistors is instead to fabricate conventional transistors in a semiconductor substrate and then transfer these transistors onto a display substrate. U.S. Patent Application Publication No. 2006/0055864 A1 by Matsumura et al. teaches a method for the assembly of a display using semiconductor integrated circuits (ICs) affixed within the display for controlling pixel elements where the embedded transistors in the ICs replace the normal functions performed by the TFTs of prior-art displays. Matsumura teaches that the semiconductor substrate should be thinned, for example by polishing, to a thickness of between 20 micrometers to 100 micrometers. The substrate is then diced into smaller pieces containing the integrated circuits, hereafter referred to as 'chiplets'. Matsumura teaches a method of cutting the semiconductor substrate, for example by etching, sandblasting, laser-beam machining, or dicing. Matsumura also teaches a pick-up method where the chiplets are selectively picked up using a vacuum chuck system with vacuum holes corresponding to a desired pitch. The chiplets are then transferred to a display substrate where they are embedded in a thick thermoplastic resin. Wiring interconnections within the pixel-control device and connections from busses and control electrodes to the pixel-control device are shown. In order for wiring interconnections to be successfully made to the chiplets, it is necessary to locate the chiplets with a high degree of accuracy and reliability. If the substrate is contaminated or improperly prepared, chiplets cannot adhere or align adequately, thus preventing the substrate from operating properly. In particular, chiplets cannot be present in some locations or can be present but not properly positioned.

There is a need therefore, for a manufacturing process that corrects substrates for missing or improperly aligned chiplets.

SUMMARY OF THE INVENTION

In accordance with the present invention, a method of providing chiplets over a substrate comprising providing in sequence:

(a) providing a substrate;

(b) coating an adhesive in a layer over the substrate;

(c) placing a plurality of first chiplets onto the adhesive layer in separated chiplet location(s) to adhere the first chiplets to the adhesive layer, wherein one or more of the first chiplets do not adhere to the adhesive layer, so that first chiplet(s) are adhered to the adhesive layer in adhered chiplet location(s) and first chiplet(s) are not adhered in non-adhered chiplet location(s);

(d) locally processing the adhesive layer in the non-adhered chiplet location(s) to condition the adhesive layer in the non-adhered locations to receive second chiplets;

(e) placing second chiplet(s) onto the adhesive layer in the conditioned non-adhered chiplet location(s) to adhere the second chiplets in the adhesive layer in the non-adhered locations; and (f) curing the adhesive.

An advantage of the present invention is that it can correct missing or misaligned chiplets on a substrate, thereby improving yields.

The drawings are necessarily of a schematic nature since layer thickness dimensions can be in the sub-micrometer ranges, while features representing lateral device dimensions can be in a range from 10 micrometers to a meter or more. Accordingly, the drawings are scaled for ease of visualization rather than for dimensional accuracy.

DETAILED DESCRIPTION OF THE INVENTION

The present invention is addressed to a manufacturing method of providing chiplets over a substrate, each chiplet including a separate and independent substrate forming an integrated circuit with control circuitry and connection pads. The chiplets are distributed and placed over the substrate to locally control elements formed upon, or located over, the substrate. However, the process of placing the chiplets on the substrate can fail. This failure causes missing or misaligned chiplets on the substrate. Therefore, according to the present invention, a method is provided to correct the substrates so that chiplets are properly positioned in the desired locations over the substrate.

Figure 1:
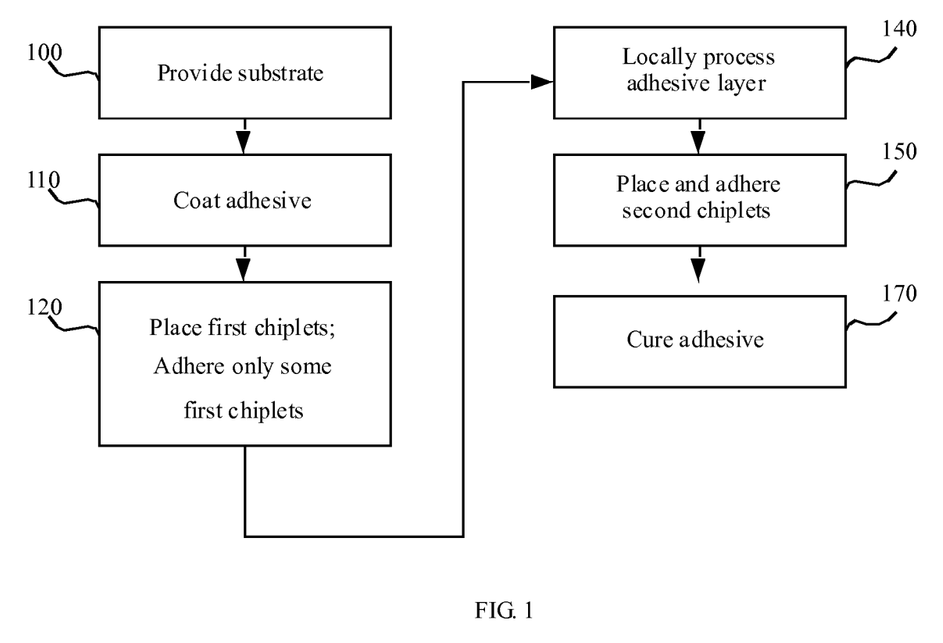
FIG. 1 is a flow chart illustrating an embodiment of the method of the present invention.

Referring to FIG. 1, in an embodiment of the present invention, a method of providing chiplets over a substrate includes sequentially providing (Step 100) a substrate, coating (Step 110) an adhesive in a layer over the substrate, placing (Step 120) a plurality of first chiplets onto the adhesive layer in separated chiplet location(s), to adhere the first chiplets to the adhesive layer, wherein one or more of the first chiplets do not adhere to the adhesive layer, so that first chiplet(s) are adhered to the adhesive layer in adhered chiplet location(s) and first chiplet(s) are not adhered in non-adhered chiplet location(s), locally processing (Step 140) the adhesive layer in the non-adhered chiplet location(s) to condition the adhesive layer in the non-adhered locations to receive second chiplets, placing (Step 150) second chiplet(s) onto the adhesive layer in the conditioned non-adhered chiplet location(s) to adhere the second chiplets in the adhesive layer in the non-adhered locations, and curing (Step 170) the adhesive to affix the chiplets to the substrate. Suitable adhesives include, for example benzocyclobutene, polyimides, and commercially available materials such as Intervia Photodielectric 8023 from Rohm and Haas. The adhesive is selected to have the property that it lightly adheres or secures chiplets, can form a planarizing surface, can be cured, or can be cured as described below.

According to the present invention, an adhered chiplet is one adhered to the adhesive layer in the proper adhered-chiplet location with the proper alignment and rotation. A non-adhered location is a location in which no chiplet is present or in which a chiplet is present but improperly located, aligned, or rotated. Hence, leaving no first chiplet(s) in non-adhered chiplet location(s) means that there is not a properly located, aligned, and rotated chiplet in the chiplet location.

By locally processing the adhesive layer in the non-adhered chiplet location(s) to condition the adhesive in the non-adhered location(s) is meant that a portion of the adhesive layer in a non-adhered location is modified in some fashion, for example by mechanical, chemical, or optical processing, or by adding, changing, or removing material in the non-adhered location(s). By locally processing is also meant that a misaligned chip let in the non-adhered location is modified in some fashion, for example by mechanical, chemical, optical processing, or by adding, changing, or removing material. By locally processing is also meant that any undesirable material, such as contaminating chemicals or 20 particles in the non-adhered location are removed, buried, destroyed, or otherwise changed in nature, location, or position with respect to other materials.

Figure 2A:
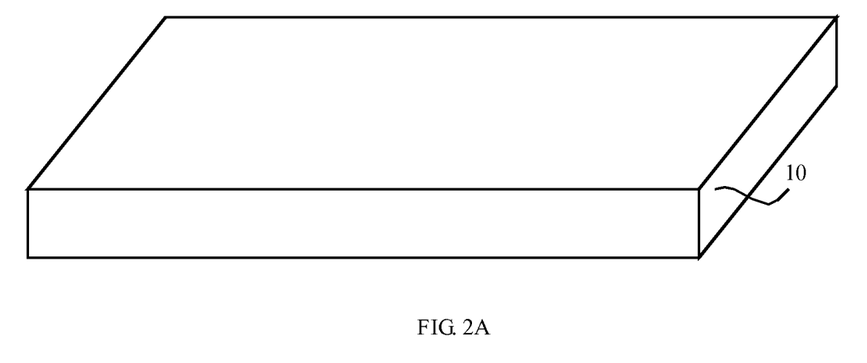
FIGS. 2A-2C are plan views of a substrate, adhesive layer, and chiplets in various stages of assembly according to an embodiment of the present invention.
Figure 2B:
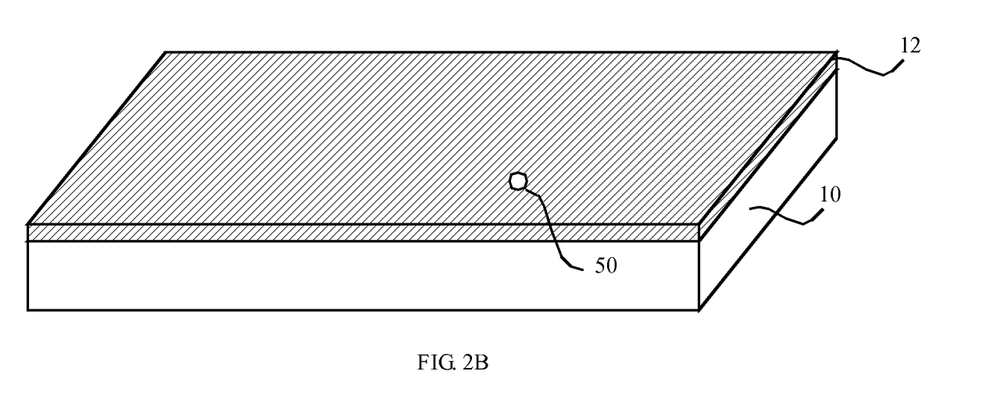
Figure 2C:
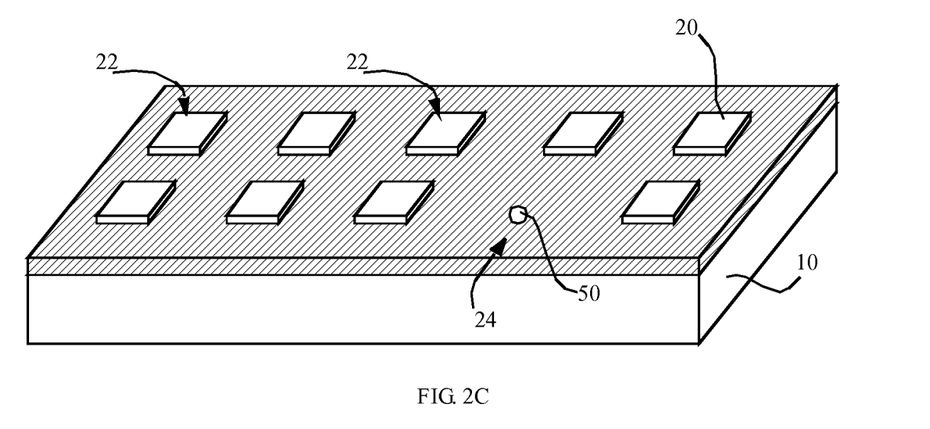
Figure 3:
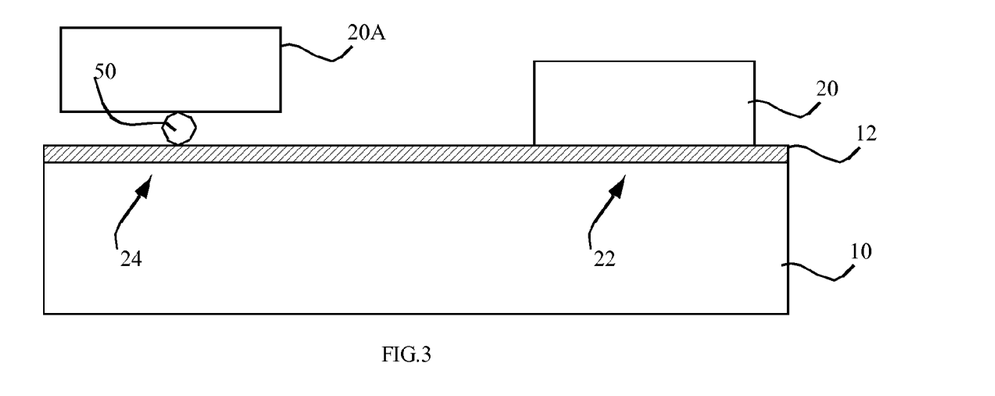
FIG. 3 is a cross-section of a substrate with a particle contaminant according to an embodiment of the present invention.

Referring to FIG. 2A, a substrate 10 is shown. The substrate 10 can have patterned conductors or other layers or components located thereon. As shown in FIG. 2B, an adhesive layer 12 is coated over the substrate 10. The adhesive layer 12 can be curable so that it provides only a slight adhesion when coated but provides a very strong adhesion when cured to adhere chiplets firmly in place during any subsequent processing steps, for example photolithographic or material coating steps, such as spin coating, curtain coating, evaporation, sputtering, or etching. Referring to FIG. 2C, first chiplets 20 are located over the substrate 10 and adhesive layer 12 in separated chiplet locations, for example by positioning with a vacuum chuck as described by Matsumura. The adhesive layer 12, even if uncured, is sufficient to adhere the first chiplets 20 in position prior to a subsequent curing step. According to a method of the present invention, however, only some of the first chiplets 20 adhere to the adhesive layer 12 in adhered chiplet locations 22. Some of the first chiplets 20 do not properly adhere to the adhesive layer 12 in non-adhered locations 24 for a variety of reasons, for example contaminating material such as particles 50 can be present, adhesive material can not be present if the adhesive coating operation did not provide a uniform coating, or the adhesive material could have been exposed to chemicals in non-adhered locations and lost its adhesive quality. For simplicity, FIG. 2C illustrates a particle 50, but the present invention is not limited thereto. Referring to FIG. 3 in a side view, the first chiplet 20 is adhered to the adhesive layer 12 on the substrate 10. A first chiplet 20A does not properly adhere to the adhesive layer 12 because of the presence of particle 50. The chiplet 20A can be removed with the chiplet placement device (not shown) or the chiplet can move to a different location or orientation on the adhesive layer 12.

The missing chiplets can be corrected in a variety of ways according to various embodiments of the present invention.

Figure 4:
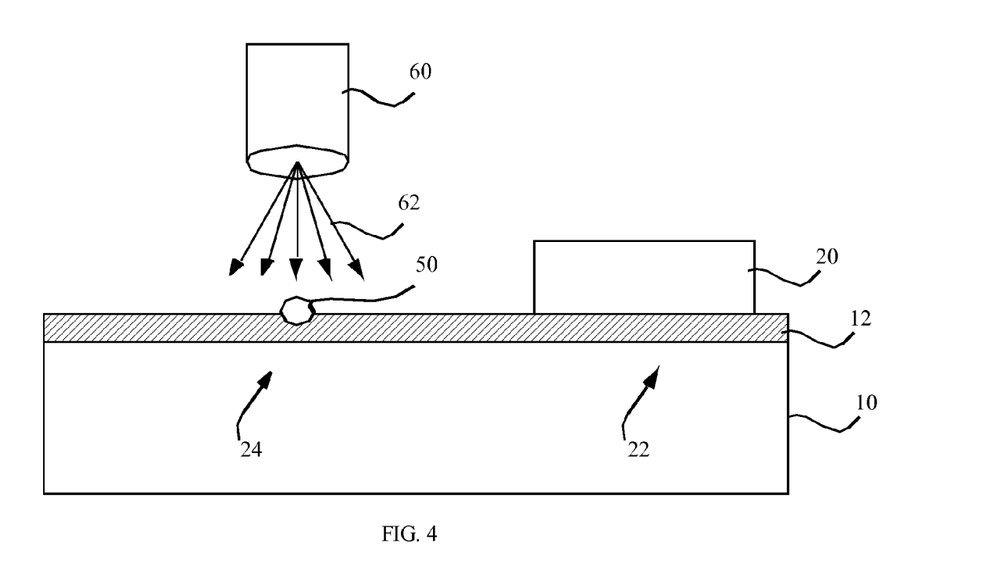
FIG. 4 is a cross-section of a substrate with a particle contaminant and laser ablation device according to an embodiment of the present invention.

Referring to FIG. 4, in one embodiment of the present invention, an ablation device 60, for example a laser ablation device, provides a beam of radiation 62 that exposes the adhesive layer 12 in the non-adhered chiplet location 24 and vaporizes the particle 50. As used herein, exposing the adhesive layer 12 includes exposing other materials, such as contaminating particles 50 that can be present on or in the adhesive layer 12. The particle 50 can either be completely destroyed or it can be broken into pieces that do not prevent chiplet adhesion. In one embodiment of the present invention, the adhesive layer 12 can be cured, for example by heat or radiation of a specific frequency range, for example infrared. The beam of radiation 62 can be chosen so that it does not cure the adhesive and thereby maintains the adhesive quality of the adhesive layer 12 in the non-adhered chiplet location 24 in a condition for receiving a second chiplet. For example, the adhesive can be cured by heat or infrared radiation and an ultra-violet laser beam employed to vaporize the particle(s) 50.

Figure 5:
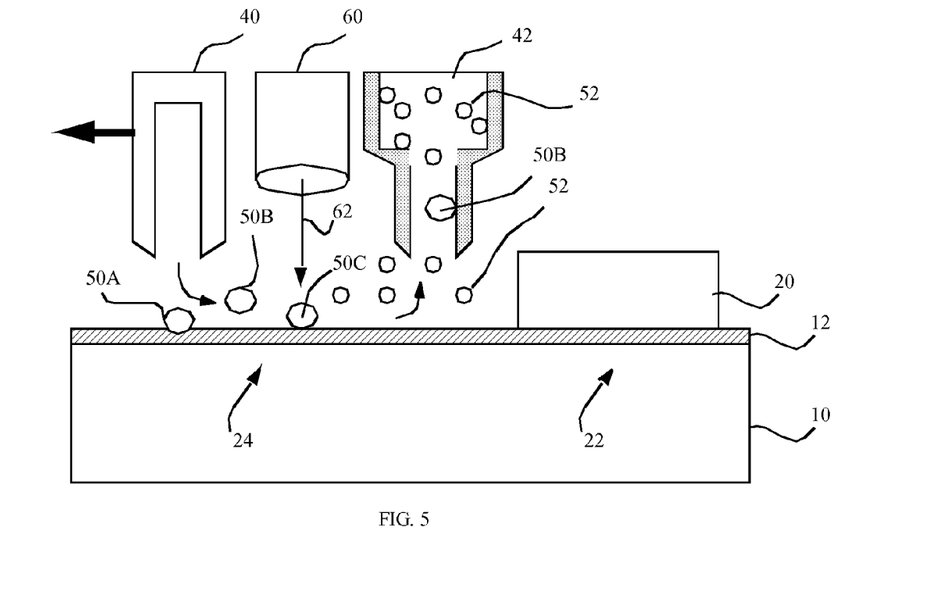
FIG. 5 is a cross-section of a substrate with a particle contaminant, micro gas jet, laser ablation device, and suction device according to an embodiment of the present invention.

In a further embodiment illustrated in FIG. 5, a micro gas jet device 40 can blow particle(s) 50A off of the adhesive layer 12 and suspend particle(s) 50B in the atmosphere (or in a vacuum) to be suctioned up by a micro suction device 42 that has a lower pressure than the ambient pressure. In another embodiment of the present invention, the ablation device 60 can be supplemented by the micro gas jet device 40 and micro suction device 42, so that dislodged particle(s) 50B or particle(s) 50C remaining on the adhesive layer 12 are vaporized and vapor 52 is removed by the micro suction device 42. Alternatively, the particles can be dislodged and subsequently vaporized.

Figure 6:
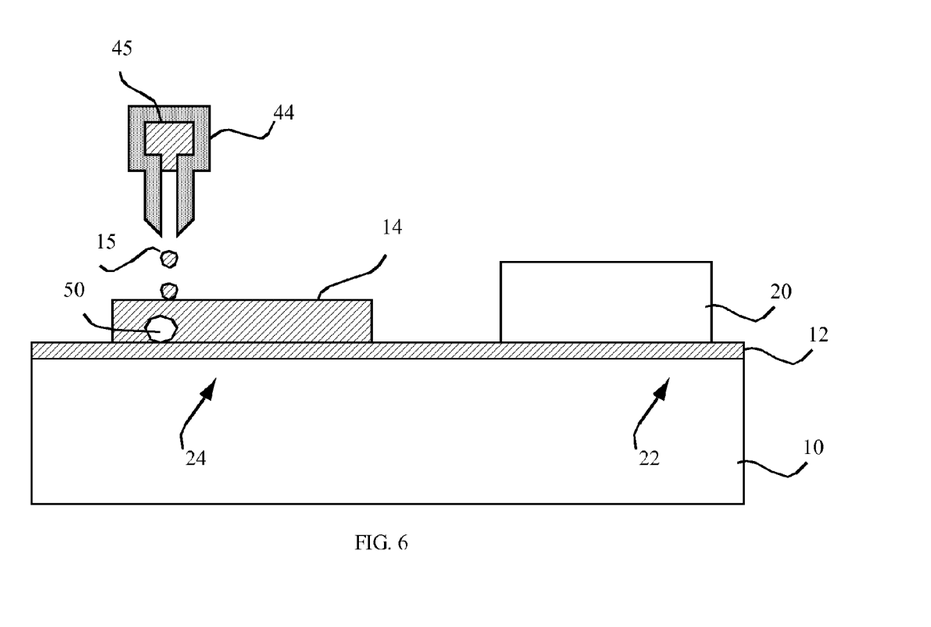
FIG. 6 is a cross-section of a substrate with a buried particle contaminant and a micro-dispenser according to an embodiment of the present invention.
Figure 7:
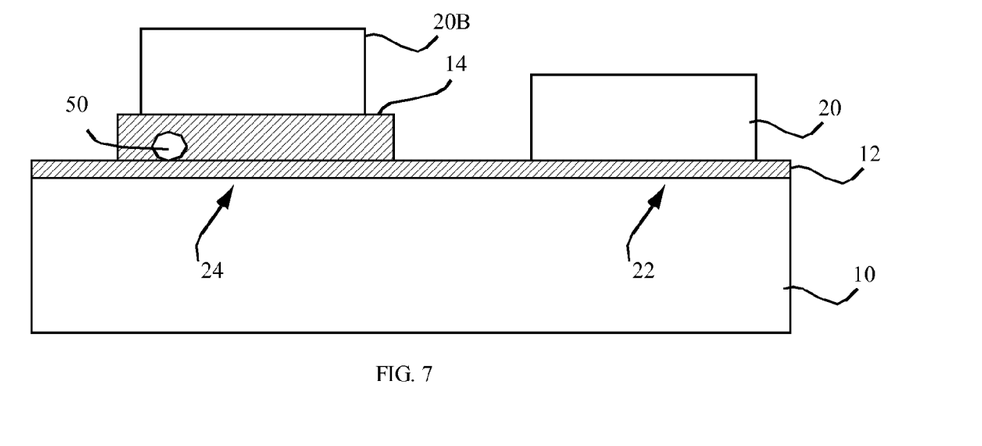
FIG. 7 is a cross-section of a substrate with a buried particle contaminant and a second chiplet located over the buried particle according to an embodiment of the present invention.

In an alternative embodiment of the present invention, an inkjet or micro-dispenser 44 can dispense droplets 15 of additional adhesive from a supply 45 of adhesive over particles 50 to bury, dislodge, or relocate the particles 50 and form a local additional adhesive layer 14 of additional adhesive over the adhesive layer 12. The local additional adhesive layer 14 of additional adhesive can planarize the surface of the adhesive layer 12 in the non-adhered chiplet locations 24. It is not necessary, in all cases, that the additional adhesive droplets form a local additional adhesive layer 14. For example, the droplets 15 of additional adhesive can dislodge the particle(s) 50 to a different location where it will not prevent a chiplet from adhering to the planarized surface of the local additional adhesive layer 14 formed by the droplets 15 of adhesive. In an embodiment of the present invention, the droplets 15 of additional adhesive comprise the same material as is employed in the adhesive layer 12. As shown in FIG. 7, once the particle(s) 50 are buried or dislodged by the droplets 50 of additional adhesive, a second chiplet 20B can be positioned over the local additional adhesive layer 14.

Figure 8:
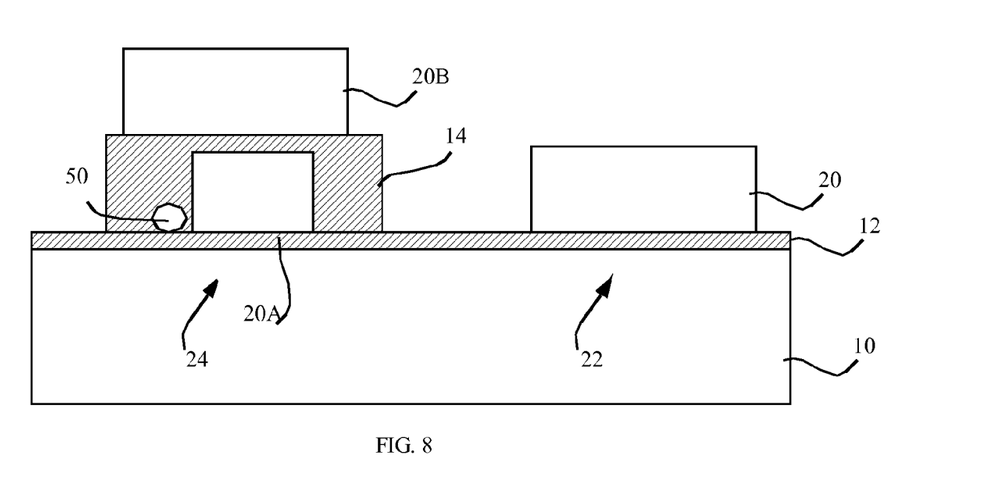
FIG. 8 is a cross-section of a substrate with a buried particle contaminant, misaligned first chiplet, and a second chiplet located over the buried particle and first chiplet according to an embodiment of the present invention.

As shown in FIG. 8, the local additional adhesive layer 14 can also be employed to bury a misaligned chiplet 20A. According to the present invention, a non-adhered chiplet can be an adhered but misaligned chiplet. Therefore, a chiplet can be present in a non-adhered chiplet location 24 and the droplets 15 of additional adhesive can form the local additional adhesive layer 14 that buries the misaligned chiplet 20A. In FIG. 8, the misaligned chiplet 20A is shown rotated to indicate a misalignment. Once the misaligned chiplet 20A is buried by local additional adhesive layer 14, a second chiplet 20B can be properly located over the local additional adhesive layer 14. The additional adhesive can effectively planarize the local additional adhesive layer 14, forming a layer over a contaminating particle or filling in gaps in adhesive material in the adhesive layer 12.

Figure 9:
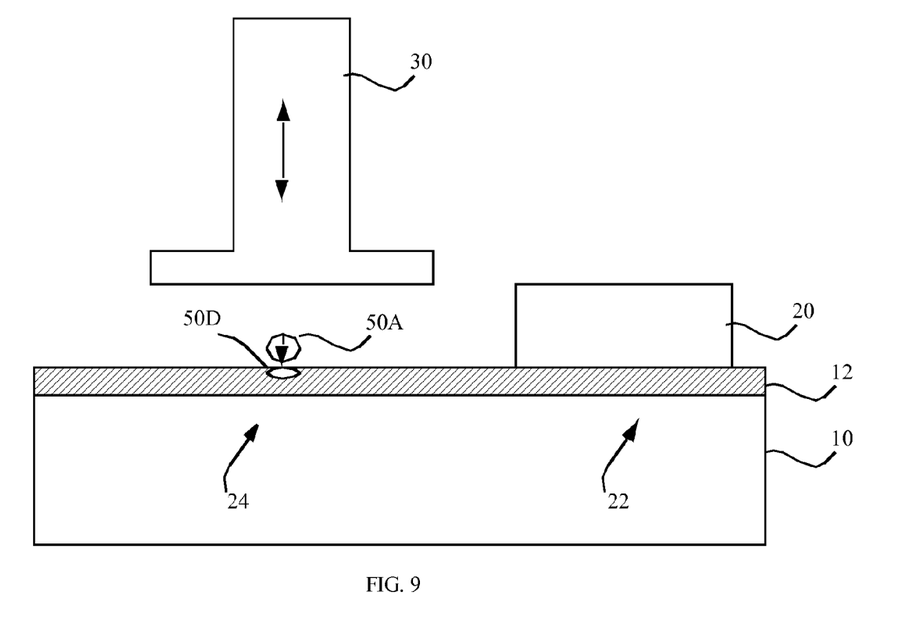
FIG. 9 is a cross-section of a substrate with a particle contaminant and a stamp according to an embodiment of the present invention.
Figure 10A:
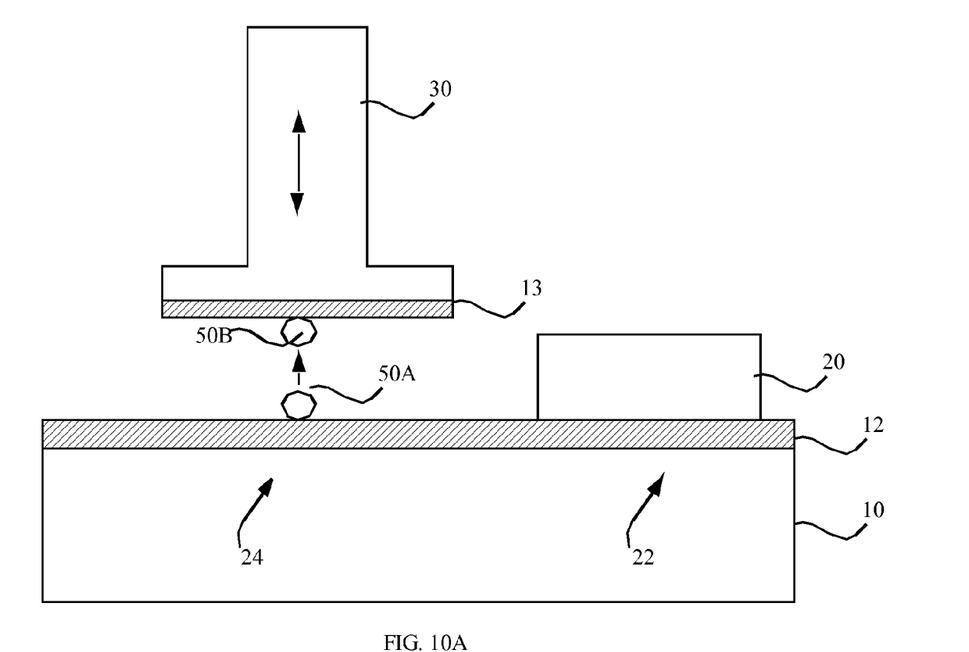
FIG. 10A is a cross-section of a substrate with a particle contaminant and a stamp with an adhesive coating according to an embodiment of the present invention.

In yet another embodiment of the present invention illustrated in FIG. 9, a stamp 30 can press down upon the adhesive layer 12 in the non-adhered chiplet location 24 and compress an adhered particle 50A into a compressed particle 50D that can also be pressed into the adhesive layer 12. The non-adhered chiplet location 24 can then receive a second chiplet 20. Referring to FIG. 10A, in a further embodiment of the present invention, the stamp 30 can have a stamp adhesive layer 13 to which dislodged particle(s) 50B can adhere when the stamp 30 comes in contact with the adhesive layer 12. The dislodged particle(s) can preferentially adhere to the stamp 30 and stamp adhesive layer 13 by employing a stronger adhesive in the stamp adhesive layer 13 than is employed in the adhesive layer 12.

Figure 10B:
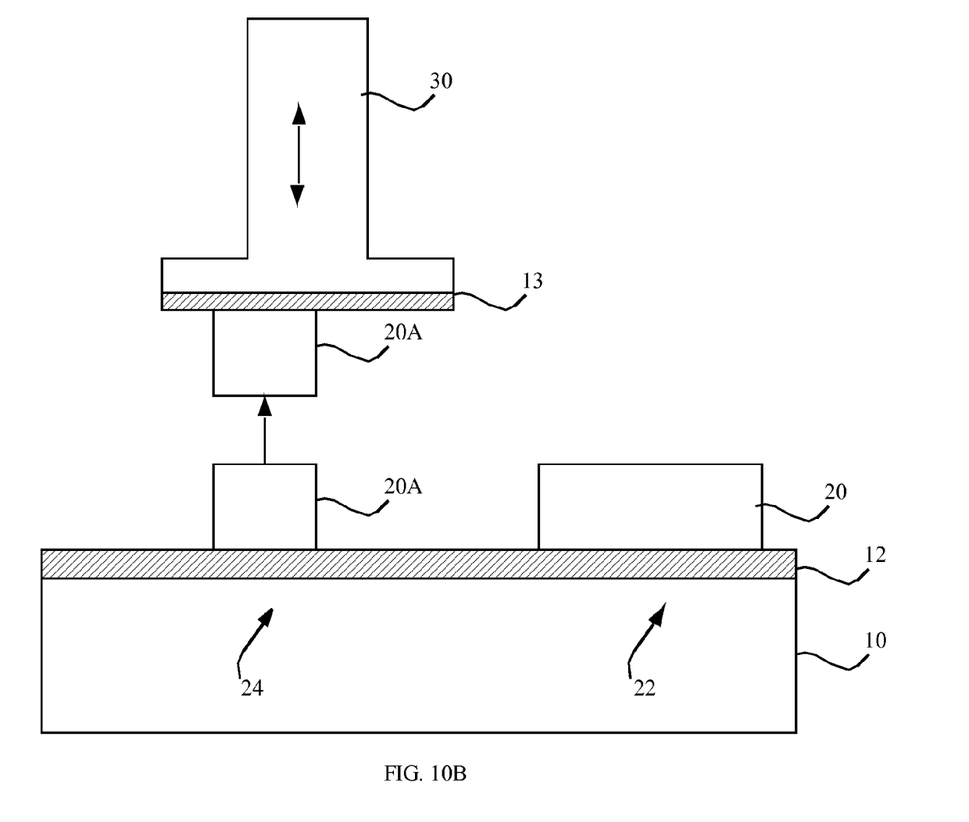
FIG. 10B is a cross-section of a substrate with a misaligned chiplet in a non-adhered location and a stamp with an adhesive coating according to an embodiment of the present invention.

Referring to FIG. 10B, in a further embodiment of the present invention, a misaligned chiplet can be removed by employing the stamp 30 to press down upon the misaligned chiplet 20A, adhering the misaligned chiplet 20A to the stamp adhesive layer 13 on the stamp 30, and removing the stamp 30 and misaligned chiplet 20A together. The non-adhered chiplet location 24 can then receive a second chiplet 20. Additional adhesive can be provided on the substrate 10 before positioning the second chiplet 20, as described below and with respect to FIGS. 6 and 7.

According to further embodiments of the present invention, the particle removal methods described above can be used in combination. In particular, it can be useful to deposit additional adhesive droplets to form a local additional adhesive layer 14 after dislodging, ablating, or suctioning contaminating particles. Furthermore, in cases wherein the adhesive layer 12 is not uniform over the substrate 10 and the adhesive material is not present in a particular non-adhered chiplet location 24, the local addition of additional adhesive material will permit a second chiplet 20 to be adhered. It is also possible that vaporized, ablated organic material can redeposit over the adhesive layer 12 in the non-adhered chiplet locations 24, rendering the adhesive layer 12 ineffective. It is possible that the use of the stamp 30 having a stronger adhesive coating can cause the adhesive layer 12 to be removed from the substrate 10. Again, the local addition of additional adhesive material can permit a second chiplet 20 to be adhered.

Thus, the chiplet adhesion problems of the prior art due to various particle contaminants or non-uniformities in the adhesive layer 12 can be overcome by one or more of the methods described and thereby improve the yields of substrates employing chiplets.

The method of the present invention can be implemented with the use of imaging devices and analysis software intended to detect the presence, absence, or alignment of chiplets on a substrate. For example digital cameras can photograph the substrate and a computer-based software image-processing program employed to detect the presence, absence, or alignment of chiplets on a substrate. The results of such analysis can be used to mechanically direct the operation of laser ablation devices, micro-dispensers, micro gas jets, suction devices, and stamps.

The present invention can be employed to construct display devices having an array of pixel formed thereon, the pixels driven by circuits provided in chiplets, for example organic or inorganic light-emitting diode devices.

Stamping processes such as those described herein are described in Matsumaru (referenced above).

As described above, once a substrate is fully populated with operative chiplets, the substrate and chiplets can be processed to electrically interconnect the chiplet(s) with wires formed over the substrate. Organic electro-luminescent structures (e.g. OLEDs) responsive to the chiplets can then be formed over the substrate. The wires are employed to drive the circuits and operate the device.

According to various embodiments of the present invention, the chiplets can be constructed in a variety of ways, for example with one or two rows of connection pads along a long dimension of a chiplet. Interconnection busses can be formed from various materials and use various methods for deposition on the device substrate. For example, the interconnection busses can be metal, either evaporated or sputtered, for example aluminum or aluminum alloys. Alternatively, the interconnection busses can be made of cured conductive inks or metal oxides. In one cost-advantaged embodiment, the interconnection busses are formed in a single layer.

The present invention is particularly useful for multi-pixel device embodiments employing a large device substrate, e.g. glass, plastic, or foil, with a plurality of chiplets arranged in a regular arrangement over the device substrate. Each chiplet can control a plurality of pixels formed over the device substrate according to the circuitry in the chiplet and in response to control signals. Individual pixel groups or multiple pixel groups can be located on tiled elements, which can be assembled to form the entire display.

According to embodiments of the present invention, chiplets provide distributed pixel control elements over a substrate. A chiplet is a relatively small integrated circuit compared to the device substrate and includes a circuit including wires, connection pads, passive components such as resistors or capacitors, or active components such as transistors or diodes, formed on an independent substrate. Chiplets are separately manufactured from the device substrate and then applied to the device substrate. The chiplets are preferably manufactured using silicon or silicon on insulator (SOI) wafers using known processes for fabricating semiconductor devices. Each chiplet is then separated prior to attachment to the device substrate. The crystalline base of each chiplet can therefore be considered a substrate separate from the device substrate and over which the chiplet circuitry is disposed. The plurality of chiplets therefore has a corresponding plurality of substrates separate from the device substrate and each other. In particular, the independent substrates are separate from the substrate on which the pixels are formed and the areas of the independent, chiplet substrates, taken together, are smaller than the device substrate. Chiplets can have a crystalline substrate to provide higher performance active components than are found in, for example, thin-film amorphous or polycrystalline silicon devices. Chiplets can have a thickness preferably of 100 um or less, and more preferably 20 um or less. This facilitates formation of the adhesive and planarization material over the chiplet that can then be applied using conventional spin-coating techniques. According to one embodiment of the present invention, chiplets formed on crystalline silicon substrates are arranged in a geometric array and adhered to a device substrate with adhesion or planarization materials. Connection pads on the surface of the chiplets are employed to connect each chiplet to signal wires, power busses and row or column electrodes to drive pixels. Chiplets can control at least four pixels.

Since the chiplets are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet, however, also requires connection pads for making electrical connection to the wiring layer provided over the chiplets once assembled onto the display substrate. The connection pads must be sized based on the feature size of the lithography tools used on the display substrate (for example 5 um) and the alignment of the chiplets to the wiring layer (for example +/−5 um). Therefore, the connection pads can be, for example, 15 um wide with 5 um spaces between the pads. This shows that the pads will generally be significantly larger than the transistor circuitry formed in the chiplet.

The pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but much smaller active elements (e.g. transistors), the circuitry size is much reduced. A useful chiplet can also be formed using micro-electro-mechanical (MEMS) structures, for example as described in "A novel use of MEMs switches in driving AMOLED", by Yoon, Lee, Yang, and Jang, Digest of Technical Papers of the Society for Information Display, 2008, 3.4, p. 13.

The device substrate can include glass and the wiring layers made of evaporated or sputtered metal or metal alloys, e.g. aluminum or silver, formed over a planarization layer (e.g. resin) patterned with photolithographic techniques known in the art. The chiplets can be formed using conventional techniques well established in the integrated circuit industry.

The invention has been described in detail with particular reference to certain preferred embodiments thereof, but it should be understood that variations and modifications could be effected within the spirit and scope of the invention.

PARTS LIST 10 substrate
12 adhesive layer
13 stamp adhesive layer
14 local additional adhesive layer
15 droplets of adhesive
20, 20A, 20B chiplet
22 adhered chiplet location
24 non-adhered chiplet location
30 stamp
40 micro gas jet device
42 micro suction device
44 micro-dispenser
45 supply
50 particle
50A adhered particle
50B dislodged particle
50C vaporized particle
50D compressed particle
52 vapor
60 ablation device
62 radiation
100 provide substrate step
110 coat adhesive step
120 place first chiplet step
140 locally process adhesive layer step
150 place and adhere second chiplets step
170 cure adhesive

The invention claimed is:

1. A method of providing chiplets over a substrate comprising providing in sequence:

(a) providing a substrate;

(b) coating an adhesive in a layer over the substrate;

(c) placing a plurality of first chiplets onto the adhesive layer in separated chiplet locations to adhere the first chiplets to the adhesive layer, wherein one or more of the first chiplets do not adhere to the adhesive layer, so that first chiplet(s) are adhered to the adhesive layer in adhered chiplet location(s) and first chiplet(s) are not adhered or are improperly adhered in non-adhered chiplet location(s);

(d) locally processing the adhesive layer in the non-adhered chiplet location(s) to condition the adhesive layer in the non-adhered locations to receive second chiplets by forming local additional adhesive layer(s) that buries the first chiplet(s) improperly adhered in the non-adhered chiplet location(s);

(e) placing second chiplet(s) onto the adhesive layer in the local additional adhesive layer(s) to adhere the second chiplets in the adhesive layer in the non-adhered locations; and (f) curing the adhesive.

2. The method of claim 1, wherein during the coating step, particle(s) contaminate the adhesive layer in the non-adhered chiplet location(s).

3. The method of claim 1, wherein the locally processing step includes depositing additional adhesive over the adhesive layer in the non-adhered chiplet location(s).

4. The method of claim 3, wherein the additional adhesive dislodges relocates, or buries particle(s) contaminating the adhesive layer in the non-adhered chiplet location(s).

5. The method of claim 3, wherein the locally processing step includes planarizing the adhesive layer surface in the non-adhered chiplet location(s) with the additional adhesive.

6. The method of claim 3, wherein an inkjet device or micro-dispensing device is used to deposit the additional adhesive.

7. The method of claim 2, including using a gas micro jet to dislodge or remove the particle(s) from the non-adhered chiplet location(s).

8. The method of claim 2, including using gas micro-suctioning to dislodge or remove the particle(s) from the non-adhered chiplet location(s).

9. The method of claim 1, including applying a stamp to the non-adhered chiplet area.

10. The method of claim 9, wherein during the coating step, particle(s) contaminate the adhesive layer in the non-adhered chiplet location(s), and wherein applying the stamp to the non-adhered chip let area forces the particle(s) at least partially into the adhesive layer on the substrate.

* * * * *